United States Patent [19]

Birx

[11] Patent Number: 5,142,166

[45] Date of Patent: Aug. 25, 1992

[54] HIGH VOLTAGE PULSED POWER SOURCE

[75] Inventor: Daniel L. Birx, Oakley, Calif.

[73] Assignee: Science Research Laboratory, Inc., Somerville, Mass.

[21] Appl. No.: 778,313

[22] Filed: Oct. 16, 1991

[51] Int. Cl.⁵ .............................................. H03K 3/00
[52] U.S. Cl. .................................................. 307/419
[58] Field of Search .................... 361/301; 307/419; 328/65

[56] References Cited

U.S. PATENT DOCUMENTS

| | | | |
|---|---|---|---|
| 3,015,039 | 12/1961 | Morgan | 307/88 |
| 3,612,895 | 10/1971 | Niedra | 307/88 MP |
| 4,612,455 | 9/1986 | Weiner et al. | 307/419 |

Primary Examiner—Donald G. Griffin
Attorney, Agent, or Firm—Wolf, Greenfield & Sacks

[57] ABSTRACT

A high energy, high voltage pulsed power source is provided which is capable of operating at high repetition rates while not having significantly high voltages appearing at any point in the circuit except on the output line. This eliminates the need for Freon cooling the source, permitting conventional water cooling and/or air cooling techniques to be utilized, and also permits air to be used as a dielectric in the source. These advantages are achieved by commutating the voltage across a charged capacitor, using a solid state SCR or other suitable switching device, passing the resultant signal through at least one compressor stage, which reduces the pulse duration and increases the pulse voltage, and applying the output from the compressor in parallel to a primary winding on each of a plurality of transformer coils having a single wire passing therethrough. The output on the wire is equal to the compressor output voltage multiplied by the number of cores. Higher voltages may be obtained by connecting a number of the sources in series.

15 Claims, 2 Drawing Sheets

HIGH VOLTAGE PULSED POWER SOURCE

FIELD OF THE INVENTION

This invention relates to high voltage pulsed power sources and more particularly to a power source capable of delivering a pulse of many kilovolts and kiloamperes at pulse repetition frequencies of thousands of pulses per second.

BACKGROUND OF THE INVENTION

In applications such as driving a discharge laser, there is a need for producing short, high energy pulses at a high repetition rate. For example, a driver for a copper vapor laser or a $CO_2$ laser may require approximately one joule at 20-30 kv for pulses in a 10-20 nanosecond range and a 10,000 pulses per second repetition frequency. Such lasers may be utilized in uranium isotope separation and in a broad spectrum of other research, industrial, government and other applications. Heretofore, the pulse drivers for such applications have employed thyratrons to discharge energy stored in a capacitor into the laser. This capacitor is charged to the many kilovolts required by the laser. Such supplies are typically both bulky and unreliable, the bulkiness resulting at least in part from the requirement of maintaining adequate spacing between surfaces charged to a very high voltage and the reliability problem stemming from limitations on thyratron performance.

Another serious problem with such drivers is that cooling is generally accomplished by immersion of the driver in tanks filled with Freon TM 113. The Freon TM performs two functions. First, it is a coolant for elements heated by the high energy passing therethrough. Second, it serves as a high dielectric strength media supporting electric fields which are 3 to 4 times greater than can be supported by air at atmospheric pressure.

However, liquid Freon TM has serious negative environmental properties, and as a result, use of Freon TM as a coolant is being restricted and may ultimately be banned. Therefore, it is desirable to eliminate Freon TM as a coolant for such power sources. However, the few alternative coolants which have been identified and developed do not perform as well as Freon TM and are so expensive, both to make and use, that their use in sufficient quantity to permit a pulse source to be immersed therein would cost more than the pulse source itself. Therefore, both from a cost and performance standpoint, the use of such Freon TM alternatives is not desirable.

Since an alternative coolant and insulating fluid material is not readily available for such pulse sources, a second alternative is to design a pulse power source which does not require immersion in a coolant bath for electric field isolation or for cooling. It is therefore a primary object of this invention to provide such a high voltage, high energy pulse power source.

SUMMARY OF THE INVENTION

In accordance with the above, this invention provides a high energy, high voltage pulse power source capable of operating at high repetition rates which does not have a voltage significantly in excess of 1 Kv at any point in the circuit except on the output line therefrom. This reduces both the heat generated by the circuit so that the circuit may be cooled by convention water cooling and/or air cooling techniques, and also substantially reduces the magnitude of the electric fields generated so that Freon TM is not required as a high dielectric strength media, air having sufficient dielectric strength so that components may be placed more closely together without dielectric breakdown problems, permitting a more compact and thus portable power source to be developed.

More particularly, this invention provides a high voltage pulsed power source which has a high voltage charge storing element, such as a capacitor or bank of capacitors, which may be periodically discharged into a nonlinear magnetic pulse compressor. The periodic discharging of the capacitor(s) is preferably accomplished by a solid state silicon controlled rectifier (SCR), metal oxide field effect transistor (MOSFET) or other suitable device. Each input pulse applied to the compressor results in an output pulse having both a higher voltage and a shorter duration than the corresponding input pulse. The output pulses from the compressor are applied to a primary winding on each of N transformer cores where N is an integer greater than one. For a preferred embodiment, there are 12 coils for each module. An output wire passes through all of the coils and has a high voltage pulse induced thereon. When output pulses from the compressor, which output pulses are of a duration $D_o$ and a voltage $V_o$, are applied to the primary windings, the output pulses on the wire are substantially of the duration $D_o$ and of a voltage which is approximately equal to $ND_o$.

For a preferred embodiment, the compressor has at least one stage, with each stage including a capacitor and a saturable core or other means for periodically outputting a charge stored on the stage capacitor. For the preferred embodiment, there are two compressor stages. The capacitors of each stage are preferably formed from a bank of parallel-connected capacitors.

The primary winding on each of the transformer cores is preferably a conductive shroud generally covering the core, with the output pulses from the compressor being applied to the one end of each shroud in parallel and a common potential appearing at the opposite end of each shroud. The opposite ends of each shroud are electrically connected and a coaxial output is provided which is connected to across the output wire and the common connection for the opposite ends of the shrouds.

A second source may be provided which is connected in series with the original source. One way of connecting the two sources in series is to use a single output wire which passes through the cores of both sources.

Cooling is also preferably provided for selected portions of a source. The cooling is preferably water cooling for selected elements of the source, such elements being the ones which generate the most heat. Air cooling may also be provided at least for the elements of the source which are not water cooled. For a preferred embodiment, the elements which are water cooled include the SCR, the saturable cores of the compressor and the transformer cores.

The foregoing and other objects, features and advantages of the invention will be apparent from the following more particular description of preferred embodiments of the invention as illustrated in the accompanying drawings

IN THE DRAWINGS

DETAILED DESCRIPTION

Figure 1:
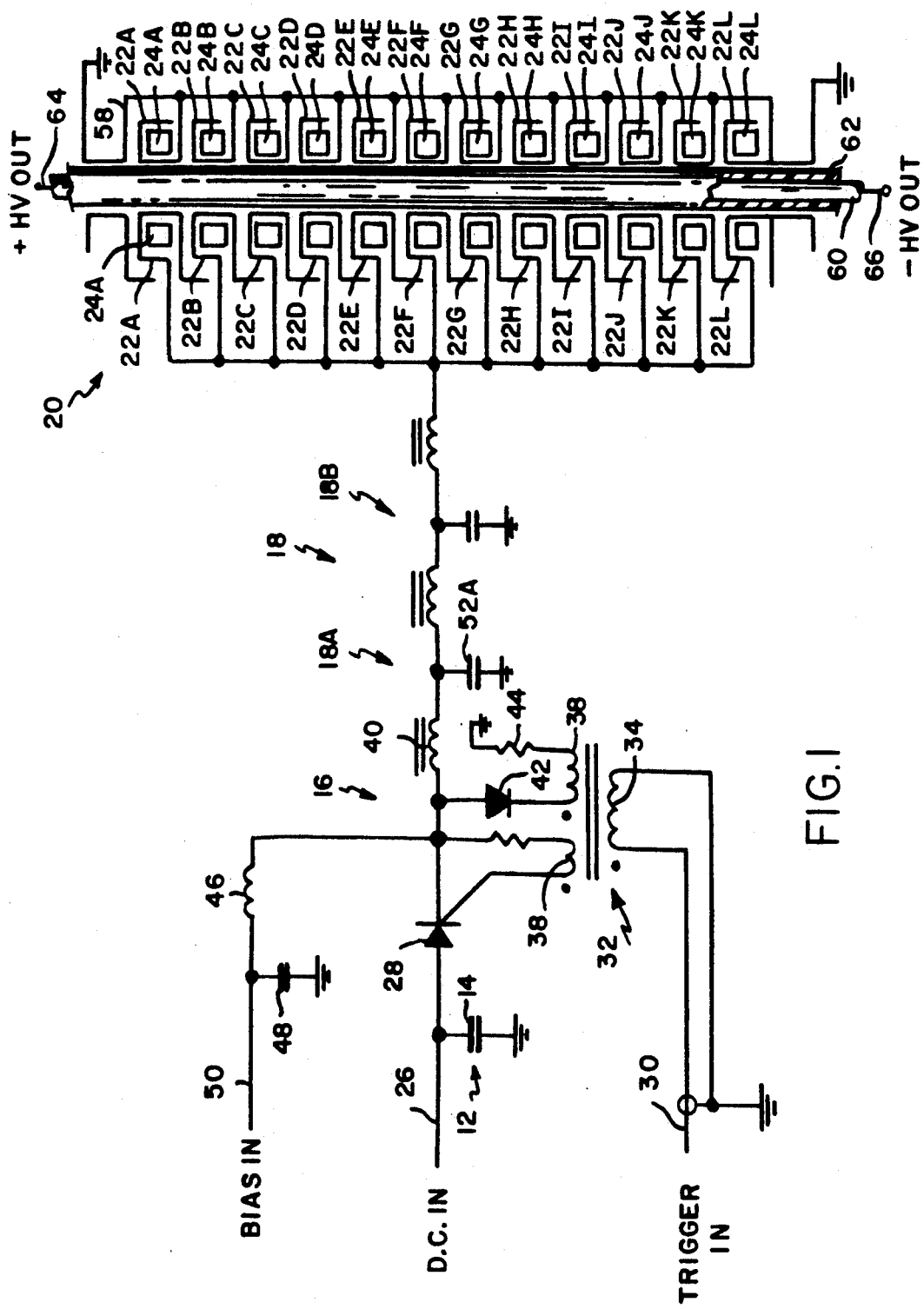
FIG. 1 is a somewhat simplified schematic diagram of a high voltage pulsed power source in accordance with a preferred embodiment of the invention.

Referring first to FIG. 1, it is seen that the high voltage pulse power supply 10 of this invention has four basic component, which are (a) an input circuit 12 including a capacitor 14 to be charged thereby; (b) a solid state SCR switching circuit 16 for commutating the charge on capacitor 14; (c) a nonlinear magnetic pulse compression circuit 18 for compressing the duration and increasing the voltage of pulses applied thereto; and (d) an induction transformer 20 having a single primary winding 22A-22L on each of a plurality of toroidal shaped magnetic cores 24A-24L. Input portion 12 has a line 26 from an external DC source (not shown). The signal applied to line 26 may, for example, be a signal of up to 1.1 kv. For preferred embodiment, the signal on line 26 is a 600 volt signal at 7.08 amps. This results in a signal having 4.25 kw power, and translates into an energy per pulse of 1.25 joules for a pulse repetition frequency of 3400 pulses per second. The DC signal on line 26 is utilized to charge capacitor 14. While a single capacitor may be used as capacitor 14, for preferred embodiments, capacitor 14 is a bank of parallel connected capacitors. For example, to achieve a 1.8 microfarads capacitance for capacitor 14, eighteen 0.1 microfarad capacitors may be connected in parallel.

The SCR switching portion 16 of circuit 10 includes a solid state SCR 28 which is triggered from a triggering source 30 having a desired pulse repetition frequency through an isolation trigger transformer 32. Transformer 32 has a primary winding 34 connected to receive the signal on line 30, a feedback winding 38, and an output winding 36 connected to the trigger input of SCR 28. Feedback winding 38 receives energy from a saturable assist coil 40 through a diode 42, a resistor or resistors 44 being provided between coil 38 and ground. Elements 38-44 help the SCR turn on, assuring full triggering of the SCR. In particular, coil 40 saturates, and thus switches to pass the SCR output a short time (for example, one microsecond) after a trigger pulse is initially applied to SCR 28, causing the SCR output to be fed back through winding 38 for this interval.

Circuit 16 also includes a bias inductor 46 and a filter capacitor 48, the filter capacitor being connected across a bias input line 50. Elements 46-50 function to reset cores 24 between drive pulses.

Nonlinear compressor 18 has two stages 18A and 18B, each of which has a capacitor (52A-52B) which is switched by a saturable core 54A-54B. Capacitors 52 are each charged when the saturable core preceding the capacitor saturates and are discharged when the saturable core of the same stage saturate. Each capacitor 52 may be a single capacitor, but is preferably a bank of parallel connected capacitors. The capacitor 52 and saturable core 54 of each stage are selected such that the core saturates at just about the time that the capacitor becomes fully charged.

The output from compressor stage 18B is connected in parallel as an input to the primary winding 22 on each core 24. For a preferred embodiment, the primary winding on each core is a generally toroidal shaped shroud with a small circular opening on one side. The output from compressor stage 18B is applied as an input to each winding on one side of the opening, the other side of the opening being connected through a common line 58 to ground or to some other source of common potential.

A single output wire 60 passes through the center of all of the cores 24. Wire 60 is formed of a conductive material such as aluminum. If the voltage across wire 60 become large enough, it may be desirable to provide an insulating sleeve 62 of quart or other suitable material surrounding wire 60 to prevent shorting between wire 60 and primary windings 22 as a result of a breakdown in the air between these conductors. An output may be taken from the power source 10 across positive terminal 64 and ground or negative terminal 66 attached to the two ends of wire 60.

Figure 2:
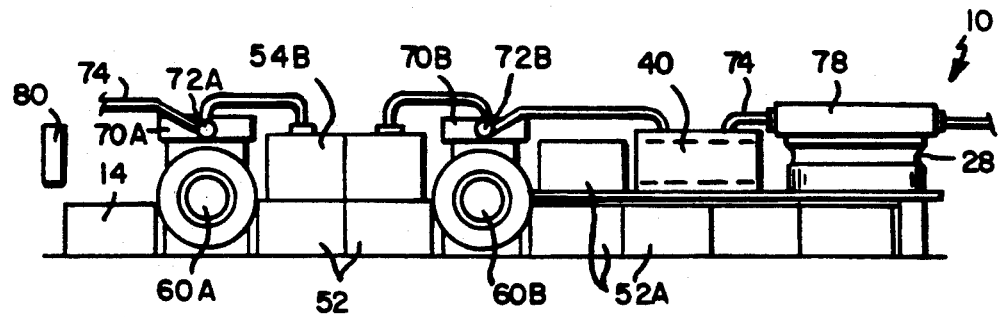
FIGS. 2 and 3 are a front view and top view respectively of the source shown in FIG. 1 for a preferred embodiment, FIG. 3 being partially broken away.
Figure 3:
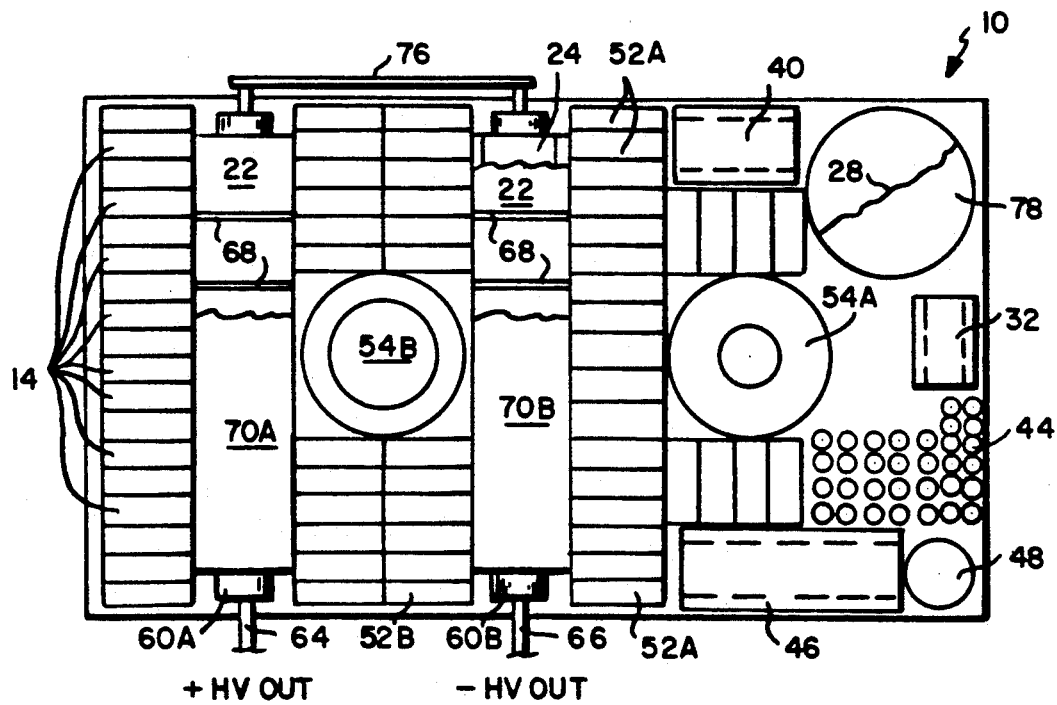

FIGS. 2 and 3 show a power source 10 of the type shown schematically in FIG. 1 as it might be laid out on a circuit board. From these figures, starting on the left, it is seen that capacitor 14 is a bank of parallel-connected capacitors. For this embodiment, 1.8 microfarads of capacitance is achieved with eighteen 0.1 microfarad capacitors. Proceeding to the right, half of the core array is shown, the cores 24 being covered in this view by the conductive windings or shrouds 22. A thin sheet 68 of insulating material, such as a sheet of Kapton ™, is provided between each adjacent pairs of cores/shrouds to prevent shorting. As may be best seen in FIG. 2, an aluminum plate 70A is secured to the top of each shroud by bolts or other suitable means. Plate 70A has a hole 72A formed therethrough with water from a water line 74 being pumped through hole 72A to cool the cores.

To the right of the first bank of cores is saturable core 54B which is positioned on top of a bank of capacitors 52B, this bank forming capacitor 52B of FIG. 1. Assuming capacitor 52B is 2 microfarads, the 24 capacitors 52B shown in FIG. 3, which capacitors are connected in parallel, would each be less than 0.1 microfarads.

To the right of the components of compressor stage 18B are the remaining cores 24 covered by shrouds 22 with heat sink plate 74B mounted on top thereof. An opening 72B is formed through plate 70B through which water may be pumped. As for the first bank of cores, a thin sheet 68 of an insulating material, such as a sheet of Kapton ™ is positioned between adjacent shrouds to prevent shorting. The wire 60A for the first bank of cores may be connected to the wire 60B of the second bank of cores by a conductive strap 76 or by other suitable conductive elements.

To the right of the second bank of cores are the capacitors 52A and saturable core 54A of compressor stage 18A. Again, a bank of parallel connected capacitors are provided to form the capacitor 52A shown in FIG. 1. On one side of coil 54A is saturable assist coil 40 and on the other side is bias inductor 46. SCR 28 is in one corner of the module and filter capacitor 48 is in another corner. Trigger transformer 32 and resistors 44, a bank of series connected resistors forming the resistor 44, are positioned on the module between elements 28 and 48. A cooling plate 78 of aluminum or other suitable material is mounted on SCR 28 and has at least one hole therethrough through which water on lines 74 may flow. Saturable cores 54A and 54B are both hollow and have a channel therethrough through which water on lines 74 also flows. Thus, provision is made for water cooling of the coils 22, SCR 28, and saturable cores 54. A fan or blower 80 may be provided to supplement the water cooling with forced air cooling for all elements of the module 10 including the elements which are not water cooled.

Figure 4:
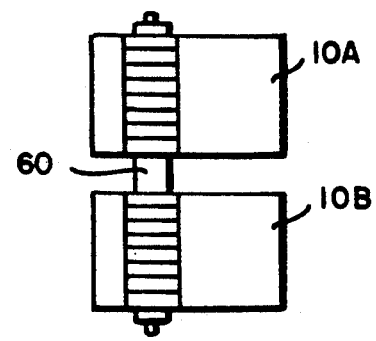
FIG. 4 is a simplified diagram of an embodiment of the invention having two pulsed sources connected in series.

FIG. 4 illustrates the fact that two modules 10A and 10B may be connected together in series to provide a greater voltage output than is obtainable with a dingle module alone. The wires 60 of the two modules may be interconnected by a conductive strap or other suitable means or, as shown in FIG. 4, a single wire 60 may pass through the cores 24 of both modules.

In operation, cooling water is initially caused to flow through lines 74 and the appropriate channels in plates 70A, 70B and 78 as well as through saturable cores 54A and 54B. Fan or blower 80 may also be turned on to assist in cooling.

Operation of the system is then initiated by applying a DC signal to line 26 to charge capacitor 14. Trigger signals are applied to line 30 such that SCR 28 switches to permit capacitor 14 to discharge therethrough each time capacitor 14 becomes fully charged. As capacitor 14 starts to discharge through SCR 28, saturable core 40 initially is not saturated causing signal to flow through diode 42 and trigger feedback winding 38 to assist in the switching of SCR 28 to assure that the SCR fully switches. When saturable coil 40 saturates, the charge from capacitor 14 is passed through to charge capacitor 52A. The components of compressor stage 18A are selected such that coil 54A saturates at roughly the same time that capacitor 52A becomes fully charged, permitting capacitor 52A to discharge through core 54A to charge capacitor 52B. Similarly, the values of compressor stage 18B are selected such that coil 54B saturates at about the time that capacitor 52B becomes fully charged. The time constants of the components in the two compressor stages are such that the pulses out of each stage are substantially shorter than the input pulses thereto; however, since the total energy remains substantially constant, there being little loss in the compressor stages, the peak voltage out of each compressor stage is greater than that of the preceding stage. Assuming, for example, a 600 volt input on line 26, the output voltage from the first stage of the compressor might be in excess of 1100 volts and the output from the second stage of the compressor might be approximately 1 kv. This 1 kv signal would be applied as an input pulse to the single input winding or shroud surrounding each core 24. Thus, the voltage at all points in the circuit described so far does not substantially exceed 1 kv, a voltage substantially less than the 20 to 30 kv normally required to, for example, drive a discharge laser. With N cores in the induction transformer 20, the resulting voltage induced in wire 60 would be equal to $NV_O$ where N is the number of cores and $V_O$ is the output voltage from compressor stage 18B. Thus, with 12 cores as shown and a 1 kv output from the compressor, 12 kv pulses would be obtained across wire 60. Since 12 kv is not normally adequate to drive a discharge laser, two modules of the type shown in FIG. 1 might be connected in series, for example, in the matter shown in FIG. 4, to obtain 24 kv pulses. Such pulses would normally be adequate for driving a copper vapor or other discharge laser. Additional modules may be provided if still higher voltage output pulses are required.

While twelve cores have been shown per module for the preferred embodiment, this is by no means a limitation on the invention, and a greater or lesser number of coils may be provided in a single module. However, twelve cores were selected as being the maximum number of cores which can be efficiently driven by an SCR of reasonable size. Larger SCRs are lossier and slower and therefore might not be suitable for generating pulses at the desired repetition rate for discharge laser applications. While the configuration shown in the figures should normally be adequate for most applications, still higher efficiencies and shorter pulses with a higher pulse repetition frequency may be obtainable by utilizing even small SCRs to drive transformers having a lesser number of cores.

While not specifically shown in the figures, output from the circuit of, for example, FIG. 1 would be obtained by connecting coaxial transmission lines to terminals 64 and 66, with wire 60 being connected to the center of each such transmission line and ground line 58 being connected to the outer wire or shield of each such line. The transmission line prevents leakage in known fashion of the output signal.

When capacitor 14 has been fully discharged through SCR 28, the trigger pulse on line 30 has disappeared and the potential at the output of the SCR drops, permitting capacitor 48, which has a negative potential thereacross, to discharge through bias inductor 46 to put a negative potential at the input of compressor 18. This negative potential is compressed and its voltage increased by compressor 18 and is applied to windings 22 to reset cores 24 in preparation for the next trigger pulse on line 30.

While for the preferred embodiment it is assumed that terminal 66 is connected to ground, this is not a limitation on the invention and this terminal may be at any desired reference potential. Thus, for example, the 12 kv voltage drop across wire 60 may be from −6 kv to +6 kv. The exact voltages utilized will vary with application.

Further, while for the preferred embodiment of the invention an SCR 28 has been shown as the switching element, other suitable switching elements may be utilized such as, for example, a MOSFET (metal oxide field effect transistor), or other suitable switching element. Similarly, other changes could be made in the specific components utilized or in the arrangement of such components while still permitting the desired functions to be achieved. Thus, while the invention has been particularly shown and described above with reference to preferred embodiments, the foregoing and other changes in form and detail may be made therein by one skilled in the art without departing from the spirit and scope of the invention.

What is claimed is:

1. A high voltage pulsed power source comprising means for storing a high voltage charge;
    nonlinear magnetic pulse compressor means;
    means for periodically applying the high voltage charge on said means for storing as a pulse input to said compressor means, the compressor means generating an output pulse of higher voltage Vo and shorter duration Do than each pulse input, there being an output pulse generated in response to each pulse input;
    N transformer cores, where N is an integer greater than one;
    a primary winding on each of said cores;

an output wire passing through all of said cores; and means for applying output pulses from said compressor means in parallel to said primary windings, resulting in output pulses across said wire having a voltage of approximately $NV_o$.

2. A source as claimed in claim 1 wherein said means for periodically applying includes a solid state SCR.

3. A source as claimed in claim 1 wherein said means for storing is a capacitance means.

4. A source as claimed in claim 1 wherein said compressor means has at least one stage, each stage including a capacitor means and means for periodically outputting a charge stored on said capacitor.

5. A source as claimed in claim 4 wherein said means for periodically outputting is a saturable core.

6. A source as claimed in claim 4 wherein said compressor means has two stages.

7. A source as claimed in claim 4 wherein each of said capacitor means is formed of a plurality of capacitors connected in parallel.

8. A source as claimed in claim 1 wherein the primary winding on each of said transformer cores is a conductive shroud generally covering the core.

9. A source as claimed in claim 8 including means for applying said output pulses to one end of each shroud, means for applying a common potential to the opposite end of each shroud, means for electrically connecting said opposite ends, a coaxial output means, and means for connecting said output wire and said means for electrically connecting to said coaxial output means.

10. A source as claimed in claim 1 including a second one of said sources, and including means for series connecting said sources.

11. A source as claimed in claim 10 wherein a single output wire functions as the output wire for both sources 12. A source as claimed in claim 1 including means for cooling at least selected portions of said source.

13. A source as claimed in claim 12 wherein said means for cooling includes means for water cooling selected elements of the source, the selected elements being the ones which generate the most heat.

14. A source as claimed in claim 13 including means for air cooling at least the elements of said source which are not water cooled.

15. A source as claimed in claim 13 wherein said means for applying is an SCR, said compressor means includes saturable core means, and wherein the selected elements which are water cooled include at least one of said SCR, said saturable core means and said transformer cores.

* * * * *